(12) United States Patent
Chen et al.

(10) Patent No.: US 8,010,915 B2
(45) Date of Patent: Aug. 30, 2011

(54) GRID-BASED FRAGMENTATION FOR OPTICAL PROXIMITY CORRECTION IN PHOTOLITHOGRAPHY MASK APPLICATIONS

(75) Inventors: Norman Shaowen Chen, Poughkeepsie, NY (US); Scott Goad, Pflugerville, TX (US); Paul Willard Ackmann, Lakeway, TX (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 489 days.

(21) Appl. No.: 12/170,988

(22) Filed: Jul. 10, 2008

(65) Prior Publication Data
US 2010/0011335 A1  Jan. 14, 2010

(51) Int. Cl.
*G06F 17/50*  (2006.01)
(52) U.S. Cl. ............................. 716/53; 716/55
(58) Field of Classification Search ........................... None
See application file for complete search history.

(56) References Cited

U.S. PATENT DOCUMENTS

| | | | | |
|---|---|---|---|---|
| 5,657,235 A * | 8/1997 | Liebmann et al. | ............ | 700/182 |
| 6,282,696 B1 * | 8/2001 | Garza et al. | .................... | 716/19 |
| 6,792,592 B2 * | 9/2004 | Keogan et al. | .................. | 716/19 |
| 7,080,349 B1 * | 7/2006 | Babcock et al. | ................. | 716/19 |
| 7,188,322 B2 * | 3/2007 | Cohn et al. | ........................ | 716/2 |
| 7,325,225 B2 | 1/2008 | Tanaka et al. | | |
| 7,376,931 B2 * | 5/2008 | Kokubun | ........................... | 430/5 |
| 7,648,803 B2 * | 1/2010 | Sivakumar et al. | ............... | 430/5 |
| 2002/0026626 A1 * | 2/2002 | Randall et al. | ................... | 716/19 |
| 2002/0045110 A1 * | 4/2002 | Ohnuma | ........................... | 430/5 |
| 2003/0149955 A1 * | 8/2003 | Ohnuma | ........................... | 716/19 |
| 2004/0044984 A1 * | 3/2004 | Keogan et al. | .................. | 716/21 |
| 2005/0278686 A1 | 12/2005 | Word et al. | | |
| 2006/0195809 A1 * | 8/2006 | Cohn et al. | ........................ | 716/10 |
| 2007/0079277 A1 * | 4/2007 | Golubtsov et al. | .............. | 716/19 |
| 2008/0032204 A1 * | 2/2008 | Herold | ............................... | 430/5 |
| 2008/0141203 A1 * | 6/2008 | Scaman | ........................... | 716/9 |

* cited by examiner

*Primary Examiner* — Stacy A Whitmore
(74) *Attorney, Agent, or Firm* — Ingrassia Fisher & Lorenz, P.C.

(57) ABSTRACT

An optical proximity correction (OPC) method for photolithography applications can be utilized to reduce the processing time, cost, and post-OPC file size associated with conventional methods. The OPC method provides a target layout pattern that represents a corresponding mask pattern for a photolithography mask, and aligns the target layout pattern relative to a suitably dimensioned fragmentation grid. Then, at least one feature of the target layout pattern is fragmented using the fragmentation grid. Thereafter, a fragment data set is generated in response to the grid-based fragmentation of the target layout pattern.

20 Claims, 5 Drawing Sheets

GRID-BASED FRAGMENTATION FOR OPTICAL PROXIMITY CORRECTION IN PHOTOLITHOGRAPHY MASK APPLICATIONS

TECHNICAL FIELD

Embodiments of the subject matter described herein relate generally to semiconductor device manufacturing processes. More particularly, embodiments of the subject matter relate to fragmentation techniques for optical proximity correction of photolithographic mask patterns.

BACKGROUND

The formation of various integrated circuit (IC) structures on a wafer often relies on lithographic processes, sometimes referred to as photolithography, or simply lithography. As is well known, lithographic processes can be used to transfer a pattern of a photomask (also referred to herein as a mask or a reticle) to a wafer.

For instance, patterns can be formed from a photoresist layer disposed on the wafer by passing radiation energy through a mask having an arrangement to image the desired pattern onto the photoresist layer. As a result, the pattern is transferred to the photoresist layer. In areas where the photoresist is sufficiently exposed and after a development cycle, the photoresist material can become soluble such that it can be removed to selectively expose an underlying layer (e.g., a semiconductor layer, a metal or metal containing layer, a dielectric layer, a hard mask layer, etc.). Portions of the photoresist layer not exposed to a threshold amount of radiation energy will not be removed and serve to protect the underlying layer during further processing of the wafer (e.g., etching exposed portions of the underlying layer, implanting ions into the wafer, etc.). Thereafter, the remaining portions of the photoresist layer can be removed. Although the above refers to a positive resist process, negative resist processes can also be utilized to pattern a photoresist layer.

There is a pervasive trend in the art of IC fabrication to increase the density with which various structures are arranged. For example, feature size, line width, and the separation between features and lines are becoming increasingly smaller. For example, nodes with a critical dimension of about 45 nanometers (nm) to about 65 nm have been proposed. In these sub-micron processes, yield is affected by factors such as mask pattern fidelity, optical proximity effects, and photoresist processing. Some of the more prevalent concerns include line end pullback, corner rounding and line-width variations. These concerns are largely dependent on local pattern density and topology.

Optical proximity correction (OPC) has been used to improve image fidelity for photolithographic applications. In general, current OPC techniques involve running a computer simulation that takes an initial data set having information relating to the desired pattern and manipulates the data set to arrive at a corrected data set in an attempt to compensate for the above-mentioned concerns. The photomask can then be made in accordance with the corrected data set. Briefly, the OPC process can be governed by a set of geometrical rules (e.g., "rule-based OPC" employing fixed rules for geometric manipulation of the data set), a set of modeling principles (e.g., "model-based OPC" employing predetermined behavior data to drive geometric manipulation of the data set) or a hybrid combination of rule-based OPC and model-based OPC.

The computer simulation can involve iteratively refining the data set using an edge placement error (EPE) value as a benchmark for the compensating process. In some OPC processes, the features and lines of the desired (or target) pattern are broken into edge fragments (or edge segments) and each edge fragment is associated with a simulation point (also referred to as a control point). The fragmented data set is manipulated based on the rules and/or models. For example, the edge fragments can be moved inward or outward. Then, a simulation can be run to determine predicted placement of the edges by simulated "imaging" of the manipulated pattern onto a wafer. The predicted edges are compared against their desired placement and, for a single point along each edge fragment such as the simulation point, a determination of how far the predicted edge placement deviates from the desired location is derived. If the predicted edge placement corresponds to the desired location, the edge placement error for that edge will be zero. As the predicted edge placement varies from the desired location, a positive or negative value in nanometers (or fractions thereof) can be derived. Determining EPE in this manner provides a one dimensional value for the offset between the desired edge (or segment thereof) and the predicted edge fragment placement.

Figure 1:
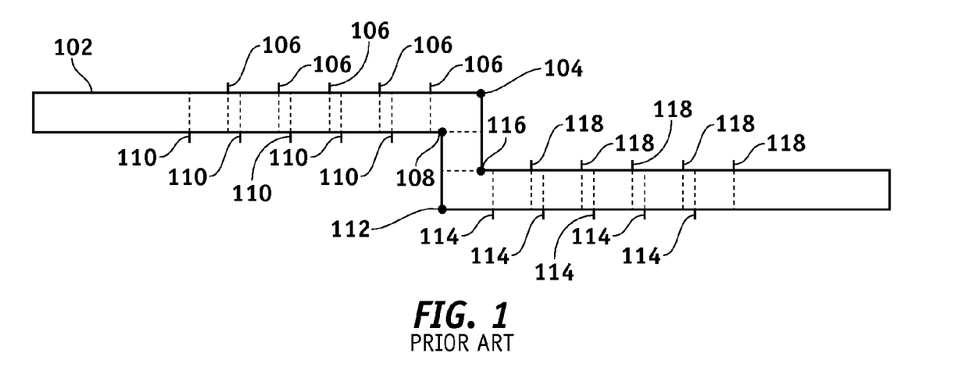
FIG. 1 is a diagram that illustrates a prior art OPC fragmentation scheme.

Conventional OPC fragmentation schemes utilize corners of the target layout pattern as reference points for the segmentation of edges. FIG. 1 is a diagram that depicts a prior art OPC fragmentation scheme for a target layout pattern 102. A first corner 104 is utilized as the reference for the uppermost horizontal edge of target layout pattern 102. This simplified example shows five equidistant fragment lines 106 that are based on first corner 104 as a reference point. Similarly, a second corner 108 is used as the reference point for equidistant fragmentation lines 110 corresponding to the opposing edge, a third corner 112 is used as the reference point for equidistant fragmentation lines 114 corresponding to the lowermost horizontal edge of target layout pattern 102, and a fourth corner 116 is used as the reference point for equidistant fragmentation lines 118 corresponding to the opposing edge. The vertical edges of target layout pattern 102 are fragmented in a similar manner using horizontal fragment lines.

The fragmentation depicted in FIG. 1 results in 21 polygonal segments (bordered by dashed lines). Notably, some of the segments are relatively small and some are relatively large; this is because the segments are not consistently aligned across the overall geometry of target layout pattern 102. Such inconsistency can result in an unnecessarily large number of polygonal segments, which can lead to longer OPC processing times, longer mask writing times, and unreasonably large file sizes for the related mask writing data.

BRIEF SUMMARY

An OPC method for photolithography applications is provided. The OPC method provides a target layout pattern that represents a corresponding mask pattern for a photolithography mask, and fragments at least one feature of the target layout pattern using a fragmentation grid. In response to the fragmentation, the method generates a fragment data set.

The above and other aspects may be carried out by an OPC method for photolithography applications. The method provides a virtual fragmentation grid comprising a plurality of gridlines, and fragments at least one feature of a target layout pattern along the plurality of gridlines to obtain a fragment data set, wherein the target layout pattern corresponds to a mask pattern for a photolithography mask. The method also processes the fragment data set to define polygons in a mask-writer-compatible format.

Also provided is a computer-executable program embodied on a computer-readable medium. The program includes computer-executable instructions for performing OPC for photolithography applications. The program includes: instructions for obtaining a target layout pattern corresponding to a mask pattern for a photolithography mask; instructions for providing a fragmentation grid comprising a plurality of gridlines; and instructions for fragmenting at least one feature of the target layout pattern along the plurality of gridlines to obtain a fragment data set.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or instructions that perform the various tasks. The program or code segments can be stored in a computer-readable, processor-readable, or machine-readable medium that can store or transfer information. Examples of such media include an electronic circuit, a semiconductor memory device, a ROM, a flash memory, an erasable ROM (EROM), a floppy diskette, a CD-ROM, an optical disk, a hard disk, or the like.

The fragmentation techniques described here create segments using a fragmentation grid that is independent of the features and layout characteristics of the target layout pattern of interest. This results in less post-OPC segments (polygons), compared to traditional corner-based techniques. For the sake of brevity, conventional techniques related to photolithography, semiconductor device fabrication, photomask creation, OPC, fragmentation, and other functional aspects of the systems (and the individual operating components of the systems) may not be described in detail herein.

Figure 2:
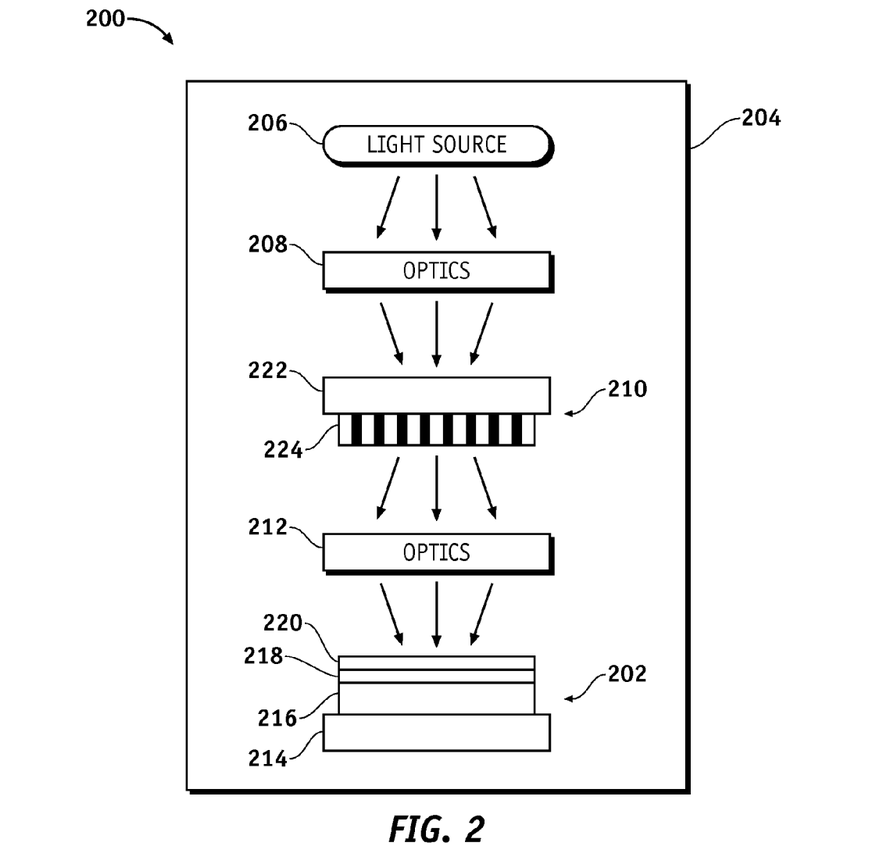
FIG. 2 is a schematic representation of a prior art lithographic system suitable for use in patterning a wafer.

FIG. 2 is a schematic representation of a conventional lithographic system 200 suitable for use in patterning a wafer 202. Lithographic system 200 includes a chamber 204, a radiation source 206, a condenser lens assembly 208 (labeled "OPTICS" in FIG. 2), a mask or a reticle 110, an objective lens assembly 212 (labeled "OPTICS" in FIG. 2), and a stage 214. Lithographic system 200 is configured to transfer a pattern or image provided on a mask or reticle 210 to a target material or surface of wafer 202.

Wafer 202 includes a substrate 216, a layer 218, and a photoresist layer 220. Photoresist layer 220 is disposed over layer 218, and layer 218 is disposed over substrate 216. Wafer 202 as depicted in FIG. 2 can be an entire semiconductor wafer or a portion thereof. Substrate 216 can be a semiconductor substrate, such as silicon, gallium arsenide, germanium, or any suitable substrate material. Substrate 216 can include one or more layers of material and/or features, such as lines, interconnects, vias, doped regions, or the like, and substrate 216 can further include devices or portions thereof, such as transistors, microactuators, microsensors, capacitors, resistors, diodes, or the like.

Layer 218 can be an insulative layer, a conductive layer, a barrier layer, or any target material to be etched, doped, treated, processed, or layered. In certain embodiments, layer 218 is a hard mask layer, such as a silicon nitride layer or a metal layer. The hard mask layer can serve as a patterned layer for processing substrate 216 or for processing a layer upon substrate 216. In yet another embodiment, layer 218 is an anti-reflective coating (ARC). Substrate 216 and layer 218 are not described in a limiting fashion, and can each comprise a conductive, semiconductive, or insulative material.

Photoresist layer 220 can comprise a variety of photoresist materials, compositions, or chemicals suitable for lithographic applications. Photoresist layer 220 is selected to have photochemical reactions in response to electromagnetic radiation emitted from radiation source 206 and to have sufficient transparency to the electromagnetic radiation to allow useful patterning of the photoresist layer. Materials comprising photoresist layer 220 can include, among others, a matrix material or resin, a sensitizer or inhibitor, and a solvent. Photoresist layer 220 may be a chemically amplified, positive or negative tone, organic-based photoresist. Photoresist layer 220 may also be a silicon-containing photoresist. Photoresist layer 220 may be, but is not limited to, an acrylate-based polymer, an alicyclic-based polymer, or a phenolic-based polymer.

Photoresist layer 220 is formed over the target material or layer of wafer 202 using any suitable technique, for example, deposition by spin coating over layer 218. The thickness of photoresist layer 220 is selected according to the particular lithographic technology, e.g., for use in vacuum ultraviolet (VUV) lithography, deep ultraviolet (DUV) lithography, and/or extreme ultraviolet (EUV) lithography (using, for example, exposing radiation having a wavelength of 193 nm, 157 nm, 126 nm, or 13.4 nm). In this regard, photoresist layer 220 may have a thickness in the range of 15-1000 nm, with a preferred thickness in the range of 50-500 nm.

Radiation source 206 provides electromagnetic radiation through condenser lens assembly 208, mask or reticle 210, and objective lens assembly 212 to photoresist layer 220. In one embodiment, radiation source 206 may be an excimer laser that produces radiation having a wavelength of 248 nm, 193 nm, 172 nm, 157 nm, or 126 nm, or a soft x-ray source that produces radiation having a wavelength of 13.4 nm. Alternatively, radiation source 206 may be any suitably configured radiation source capable of emitting radiation having a wavelength in the ultraviolet (UV), VUV, DUV, EUV, or x-ray range. Alternatively, the system may utilize a suitably configured electron/ion beam source.

Assemblies 208 and 212 include lenses, mirrors, collimators, beam splitters, and/or other optical components to suitably focus and direct a pattern of radiation (i.e., radiation from radiation source 206 as modified by a pattern or image provided on mask or reticle 210) onto photoresist layer 220. Stage 214 supports wafer 202 and can move wafer 202 relative to assembly 212.

Mask or reticle 210 is a binary mask in one embodiment. Mask or reticle 210 includes a transparent or translucent substrate 222 (e.g., glass or quartz) and an opaque or patterned layer 224 (which may be formed from chromium or chromium oxide) thereon. Opaque layer 224 provides a pattern or image associated with a desired circuit pattern, features, or devices to be projected onto photoresist layer 220. Alternatively, mask or reticle 210 may be an attenuating phase shift mask, an alternating phase shift mask, or other type of mask or reticle.

Figure 3:
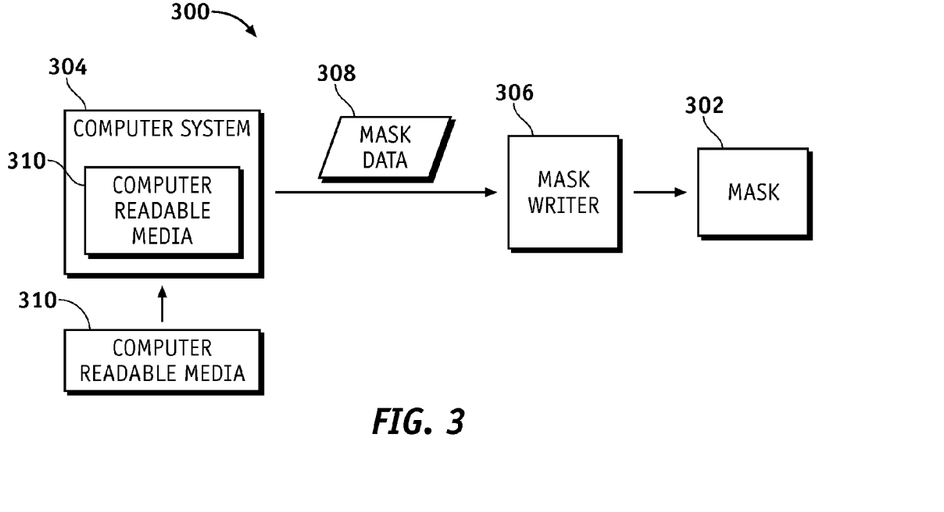
FIG. 3 is a diagram that illustrates a system and related process for creating a photolithography mask.

Described here are computerized methods, processes, and techniques that can be used to create a photolithography mask suitable for use in a system such as lithographic system 200. In this regard, FIG. 3 is a diagram that illustrates a system 300 and related process for creating a photolithography mask 302. System 300 generally includes, without limitation, a computer system 304 and a mask writer 306 that is configured to receive mask data 308 from computer system 304.

Computer system 304 may be implemented as a local system, a system coupled to a local area network, a system coupled to a wide area network, a stand-alone system, an element of a distributed computing system, a portable computing device, or the like. Computer system 304 performs OPC fragmentation in the manner described in more detail below. In practice, computer system 304 may include, cooperate with, and/or communicate with computer-readable media 310, which includes computer-executable instructions for performing the fragmentation techniques described herein (and possibly other functions, operations, and methods). As shown in FIG. 3, computer-readable media 310 may be internal to computer system 304 (e.g., a hard disk or a nonvolatile memory element) and/or computer-readable media 310 may be realized in portable form (e.g., a CD-ROM, a nonvolatile memory card or stick, or the like).

Mask data 308 may be embodied in one or more computer-readable mask writer files that are compatible with mask writer 306. In other words, computer system 304 can prepare mask data 308 in a mask-writer-compatible format such that mask writer 306 can read, interpret, and otherwise process mask data 308. As explained in more detail below, mask data 308 or the associated mask writer file may include, define, or convey, without limitation: a fragment data set, fragmentation lines for the target layout pattern, a post-OPC corrected data set, segments or polygons, and/or a fractured data set.

Mask writer 306 may be realized in a conventional manner and in accordance with well known technologies. Mask writer 306 is suitably configured to receive and process mask data 308 in an appropriate manner to create a corresponding photolithography mask 302. In practice, mask writer 306 writes photolithography mask 302 using the polygons/segments defined in mask data 308.

Figure 4:
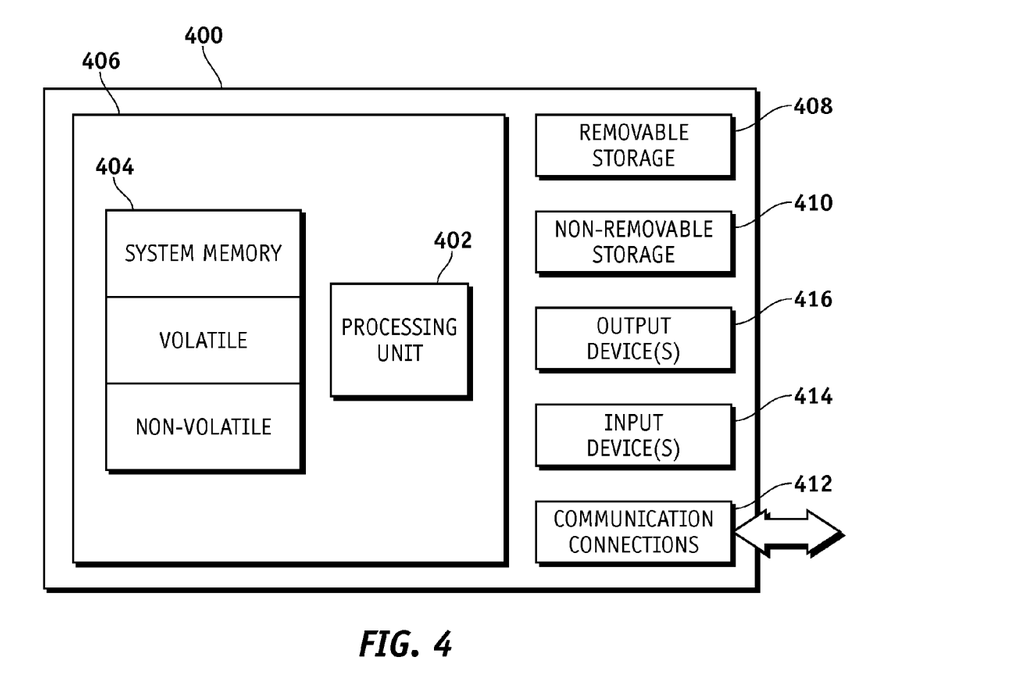
FIG. 4 is a simplified schematic representation of a computer system suitable for performing OPC fragmentation in the manner presented herein.

FIG. 4 is a simplified schematic representation of a computer system 400 suitable for performing OPC fragmentation in the manner presented herein. Computer system 400 represents one possible embodiment of computer system 304 (FIG. 3). Computer system 400 is only one example of a suitable operating environment and is not intended to suggest any limitation as to the scope of use or functionality of any practical embodiment. Other well known computing systems, environments, and/or configurations that may be suitable for use include, but are not limited to, personal computers, server computers, hand-held or laptop devices, personal digital assistants, mobile telephones, multiprocessor systems, microprocessor-based systems, programmable consumer electronics, network PCs, minicomputers, mainframe computers, distributed computing environments that include any of the above systems or devices, and the like.

Computer system 400 and certain aspects of the exemplary embodiments may be described in the general context of computer-executable instructions, such as program modules, application code, or software executed by one or more computers or other devices. Generally, program modules include routines, programs, objects, components, data structures, and/or other elements that perform particular tasks or implement particular abstract data types. Typically, the functionality of the program modules may be combined or distributed as desired in various embodiments.

Computer system 400 typically includes at least some form of computer readable media, as mentioned above with reference to FIG. 3. Computer readable media can be any available media that can be accessed by computer system 400 and/or by applications executed by computer system 400. By way of example, and not limitation, computer readable media may comprise computer storage media and communication media. Computer storage media includes volatile, nonvolatile, removable, and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can accessed by computer system 400. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

Referring again to FIG. 4, in its most basic configuration, computer system 400 typically includes at least one processing unit 402 and a suitable amount of memory 404. Processing unit 402 is preferably configured to carry out the OPC fragmentation techniques, operations, and methods described herein. Depending on the exact configuration and type of computer system 400, memory 404 may be volatile (such as RAM), non-volatile (such as ROM, flash memory, etc.) or some combination of the two. This most basic configuration is identified in FIG. 4 by reference number 406. Additionally, computer system 400 may also have additional features/functionality. For example, computer system 400 may also include additional storage (removable and/or non-removable) including, but not limited to, magnetic or optical disks or tape. Such additional storage is illustrated in FIG. 4 by removable storage 408 and non-removable storage 410. Memory 404, removable storage 408, and non-removable storage 410 are all examples of computer storage media as defined above.

Computer system 400 may also contain communications connection(s) 412 that allow the system to communicate with other devices, such as mask writer 306. In embodiments described herein, communication connection(s) 412 may include, without limitation, suitably configured interfaces that allow computer system 400 to communicate with a network such as the Internet, external databases, external memory devices, and the like. Communications connection(s) 412 may be associated with the handling of communication media as defined above.

Computer system 400 may also include or communicate with input device(s) 414 such as a keyboard, mouse or other pointing device, pen, voice input device, touch input device, etc. Computer system 400 may also include or communicate with output device(s) 416 such as a display, speakers, printer, or the like. All of these devices are well known in the art and need not be discussed at length here. During operation of computer system 400, an output device 416 may be utilized to generate an output (e.g., a display, a printed report, an electronic document, a computer-readable file, etc.) that is indicative of information, such as mask data 308.

Figure 5:
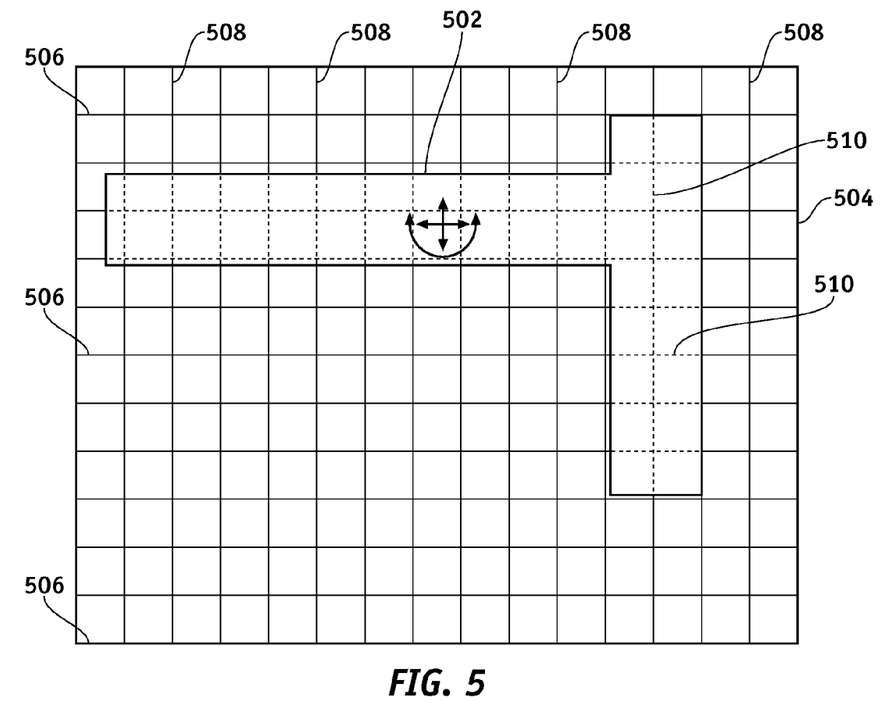
FIG. 5 is a diagram that illustrates a grid-based OPC fragmentation scheme.

A suitably configured computer system (e.g., computer system 304 or computer system 400) can carry out a grid-based OPC fragmentation scheme in lieu of, or in addition to, conventional OPC fragmentation schemes. Such a grid-based scheme utilizes a fragmentation grid that dictates the manner in which the target layout pattern will be fragmented/segmented. In this regard, FIG. 5 is a simplified diagram that illustrates a grid-based OPC fragmentation scheme for a target layout pattern 502. The target layout pattern 502 depicted in FIG. 5 has been oversimplified for ease of description. In practice, a target layout pattern may have any number of features, elements, structures, lines, corners, transitions, etc.

FIG. 5 also depicts a fragmentation grid 504 that can be utilized for grid-based fragmentation of target layout pattern 502. Fragmentation grid 504 is realized as a virtual construct or tool that is maintained by the host computer system. In practice, fragmentation grid 504 and target layout pattern 502 may be displayed by the computer system to enable user manipulation and alignment of target layout pattern 502 relative to fragmentation grid 504. In this regard, target layout pattern 502 may be superimposed on fragmentation grid 504, or vice versa.

The illustrated embodiment of fragmentation grid 504 includes orthogonal gridlines, which are depicted as horizontal gridlines 506 and vertical gridlines 508 (relative to the orientation of FIG. 5). Although orthogonal gridlines are preferred, non-orthogonal gridlines may be used in alternate embodiments. In certain embodiments, the overall size of fragmentation grid 504 is selected, adjusted, and/or configured such that the entire area of target layout pattern 502 fits within fragmentation grid 504. In addition, the number of horizontal gridlines 506, the number of vertical gridlines 508, the pitch of horizontal gridlines 506, the pitch of vertical gridlines 508, the length of horizontal gridlines 506, and/or the length of vertical gridlines 508 may be selectable, adjustable, or configurable by the user (or automatically) in response to the shape and size of target layout pattern 502. FIG. 5 depicts an embodiment where the pitch of horizontal gridlines 506 equals the pitch of vertical gridlines 508, resulting in a square fragmentation grid 504. In other embodiments, the horizontal pitch need not be equal to the vertical pitch. Moreover, the pitch (in either or both directions) need not be constant over the entire fragmentation grid 504. In practice, fragmentation grid 504 may define a square grid having a grid pitch within the range of about 40-80 nm, and a preferred grid pitch of about 60 nm. The actual dimensions of fragmentation grid 504 may depend upon the particular node technology (e.g., 60 nm node, 45 nm node, etc.), the shape, size, and/or layout of features in the target layout pattern, the wavelength of the photolithography radiation source, etc.

The system allows target layout pattern 502 and/or fragmentation grid 504 to be manipulated for purposes of aligning target layout pattern 502 relative to fragmentation grid 504 (or, equivalently, aligning fragmentation grid 504 relative to target layout pattern 502). For example, target layout pattern 502 can be moved horizontally or vertically relative to fragmentation grid 504, and target layout pattern 502 can be rotated relative to fragmentation grid 504, as indicated by the arrows in FIG. 5. Although not a requirement, it may be desirable to align target layout pattern 502 such that at least one edge (e.g., a relatively major or long edge) is orthogonal to some of the gridlines in fragmentation grid 504. FIG. 5 depicts an exemplary alignment where each edge of target layout pattern 502 is orthogonal to horizontal gridlines 506 or vertical gridlines 508. Notably, once fragmentation grid 504 has been configured, its gridlines remain fixed relative to each other. Consequently, movement of target layout pattern 502 relative to fragmentation grid 504 defines fragmentation lines 510 for target layout pattern 502, where fragmentation lines 510 correspond to and run along the gridlines. Fragmentation lines 510 are depicted as dashed lines in FIG. 5.

Figure 6:
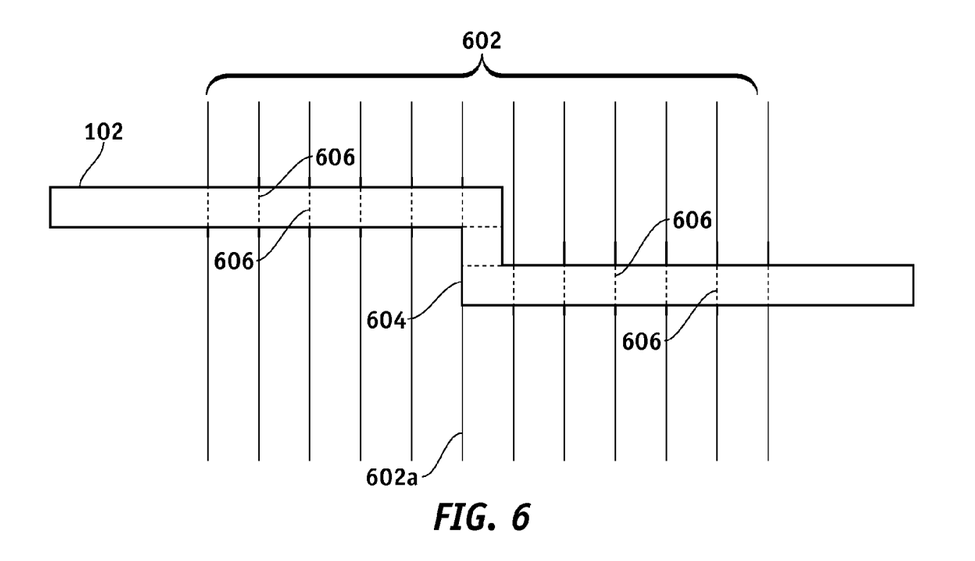
FIG. 6 is a diagram that illustrates a grid-based OPC fragmentation scheme as applied to the target layout pattern depicted in FIG. 1.

Grid-based fragmentation as described here may result in less segments and polygons than a traditional fragmentation scheme. For example, FIG. 6 is a diagram that illustrates a grid-based OPC fragmentation scheme as applied to the same target layout pattern 102 depicted in FIG. 1. For simplicity, only vertical gridlines 602 are depicted in FIG. 6. Notably, a feature or characteristic of target layout pattern 102 need not be used as a reference point for purposes of fragmentation using a fragmentation grid. Nonetheless, in FIG. 6 a vertical edge 604 of target layout pattern 102 is aligned with a vertical gridline 602a for convenience. The particular alignment of target layout pattern 102 shown in FIG. 6 results in twelve equidistant fragment lines 606 that are formed along vertical gridlines 602. For this example, the vertical edges of target layout pattern 102 are fragmented using two horizontal fragment lines.

The fragmentation depicted in FIG. 6 results in only thirteen polygonal segments (bordered by dashed lines), rather than 21 polygons as described above for the conventional approach (see FIG. 1). The reduction in segments and polygons results in shorter OPC processing times, shorter mask writing times, and smaller file sizes for the related mask writing data, relative to non-grid-based approaches. Shorter mask writing times are desirable to increase the productivity of the mask writer equipment and, in turn, reduce the manufacturing cost per mask. Smaller post-OPC file sizes are more manageable and can be transferred electronically in less time (file transfer time has real world impact where, as here, file sizes can be up to 150 gigabytes).

The grid-based fragmentation technique described here may be particularly suitable for certain features, dimensions, elements, and characteristics of a target layout pattern. Accordingly, it may be desirable to selectively apply grid-based fragmentation to take best advantage of its benefits. In other words, a practical embodiment may apply grid-based fragmentation to certain portions of the target layout pattern, and non-grid-based fragmentation to other portions of the target layout pattern. In this regard, FIG. 7 is a diagram that illustrates a hybrid OPC fragmentation scheme as applied to a target layout pattern 700.

Figure 7:
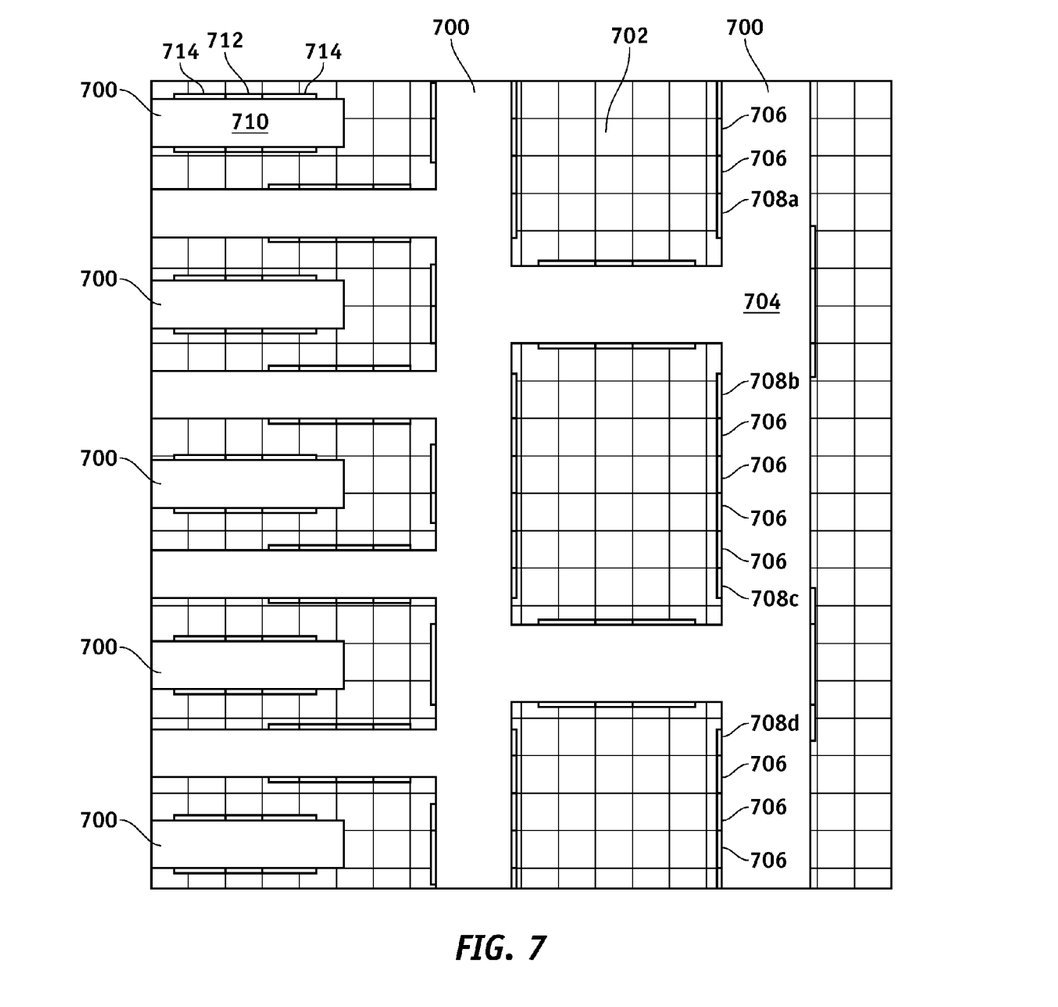
FIG. 7 is a diagram that illustrates a hybrid OPC fragmentation scheme.

The example depicted in FIG. 7 uses a square fragmentation grid 702 to perform grid-based fragmentation on some of the segments of target layout pattern 700. FIG. 7 includes fragmentation indicators along the edges of target layout pattern 700 to distinguish grid-based fragmentation from non-grid-based fragmentation. In this context, non-grid-based fragmentation refers to a fragmentation scheme that does not rely on fragmentation grid 702 for its fragmentation lines. For example, the rightmost vertical feature 704 of target layout pattern 700 includes a number of segments 706 subjected to grid-based fragmentation; these segments 706 are fragmented along the horizontal gridlines of fragmentation grid 702. In addition, vertical feature 704 includes a number of segments 708 subjected to a non-grid-based fragmentation scheme. For example, the length of segments 708a and 708b exceeds the vertical pitch of fragmentation grid 702. In contrast, the length of segments 708c and 708d is less than the vertical pitch of fragmentation grid 702. As another example, the uppermost horizontal feature 710 of target layout pattern 700 includes one segment 712 subjected to grid-based fragmentation; this segment 712 is fragmented along the vertical gridlines of fragmentation grid 702. However, horizontal feature 710 also includes two segments 714 subjected to a non-grid-based fragmentation scheme. For this example, the length of segments 714 exceeds the horizontal pitch of fragmentation grid 702.

The use of a hybrid fragmentation scheme (where grid-based fragmentation is selectively applied to certain sections of the target layout pattern) may be desirable to take best advantage of the benefits of grid-based fragmentation. In practice, the fragmentation technique may apply any number of rules, guidelines, criteria, or settings to determine whether to apply grid-based fragmentation to a feature, element, segment, or portion of the target layout pattern. Such rules, guidelines, criteria, or settings may be user-defined or automated, and they may be applied in a generic manner or on a layout-by-layout basis. For example, it may be desirable to apply non-grid-based fragmentation to sections of the target layout pattern that are relatively close (e.g., within 30-60 nm) to a corner, and to otherwise apply grid-based fragmentation. As another example, it may be desirable to apply grid-based fragmentation to sections of the target layout pattern that are less than a specified distance (e.g., less than about 240-300 nm) from a corner, and to otherwise apply a non-grid-based fragmentation scheme that is optimized for relatively long edges. As yet another example, it may be desirable to apply non-grid-based fragmentation to edges of the target layout pattern that are less than a threshold length (e.g., less than about 150-210 nm).

Figure 8:
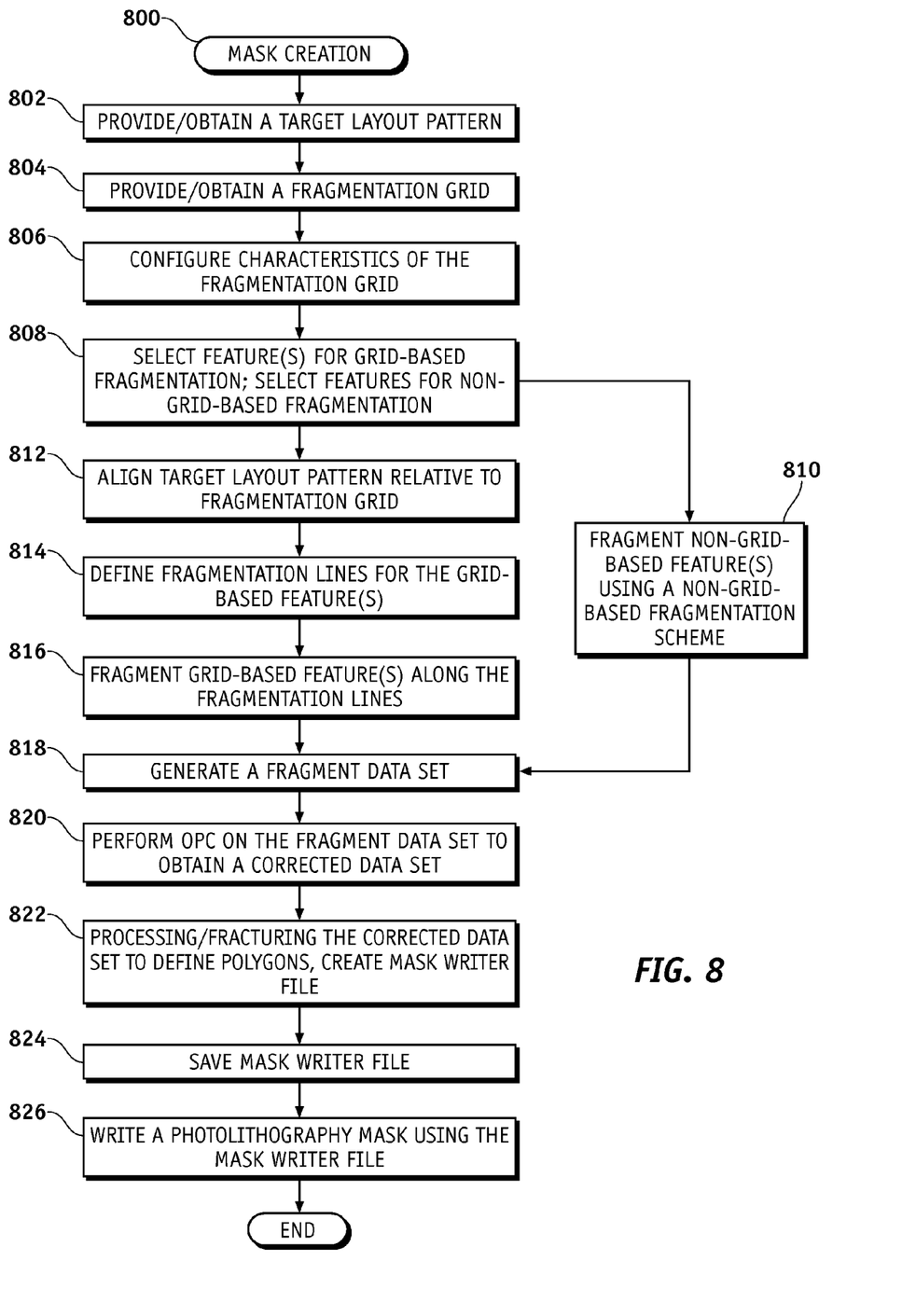
FIG. 8 is a flow chart that illustrates an embodiment of a mask creation process.

The fragmentation techniques described here can be utilized to create a photolithography mask in an effective and efficient manner. In this regard, FIG. 8 is a flow chart that illustrates an embodiment of a mask creation process 800 that leverages grid-based OPC fragmentation. The various tasks performed in connection with process 800 may be performed by software, hardware, firmware, or any combination thereof. For illustrative purposes, the following description of process 800 may refer to elements mentioned above in connection with FIGS. 2-5. In practice, portions of process 800 may be performed by different elements of the described system, e.g., a computer system, a mask writer, a functional module of a computer system, or the like. It should be appreciated that process 800 may include any number of additional or alternative tasks, the tasks shown in FIG. 8 need not be performed in the illustrated order, and process 800 may be incorporated into a more comprehensive procedure or process having additional functionality not described in detail herein.

At least a portion of mask creation process 800 can be computerized, i.e., certain tasks are performed by a computer system as described above with reference to FIG. 3 and FIG. 4. This embodiment of process 800 may begin by providing or obtaining a target layout pattern (task 802) to be subjected to OPC fragmentation. The target layout pattern represents a corresponding mask pattern for a photolithography mask. Task 802 may be associated with data entry related to the intended target layout pattern, the retrieval of stored data corresponding to the intended target layout pattern, the receiving of a suitably formatted data file that conveys the intended target layout pattern, etc. As explained above, the target layout pattern includes edges, segments, features, and/or elements that will be subjected to grid-based fragmentation and/or non-grid-based fragmentation.

Process 800 also provides or obtains an appropriate virtual fragmentation grid for the target layout pattern (task 804). Task 804 may be associated with data entry related to the creation of fragmentation grid, the retrieval of stored data corresponding to the fragmentation grid, the receiving of a suitably formatted data file that conveys the fragmentation grid, etc. In certain embodiments, process 800 facilitates the configuration of one or more characteristics or features of the fragmentation grid (task 806). In practice, task 806 may enable a user to define the overall size of the grid, the pitch of the gridlines, designate whether the gridlines are orthogonal, or the like. For instance, the examples depicted here utilize an orthogonal fragmentation grid having horizontal and vertical gridlines that define squares for the grid.

For this embodiment, process 800 selects one or more features of the target layout pattern for grid-based fragmentation, and selects one or more features for non-grid-based fragmentation (task 808). As explained previously, it may be desirable to apply grid-based fragmentation selectively to leverage the benefits of other fragmentation techniques that need not rely on the fragmentation grid. Accordingly, process 800 may fragment the designated non-grid-based feature(s) using at least one non-grid-based fragmentation scheme (task 810). Task 810 may employ existing and known fragmentation schemes, which will not be described in detail here.

In addition, process 800 aligns the target layout pattern and the fragmentation grid relative to each other (task 812). In preferred embodiments, task 812 can be performed to ensure that the edges of the target layout pattern are orthogonal to the gridlines of the fragmentation grid, as depicted in FIG. 5 and FIG. 7. After the target layout pattern has been aligned and its position has been fixed relative to the fragmentation grid, process 800 can define fragmentation lines for the grid-based feature(s) of the target layout pattern (task 814). Task 814 defines or designates the fragmentation lines such that they correspond to the gridlines of the fragmentation grid. In other words, the fragmentation lines correspond to the segments of the gridlines that would overlap (or would be superimposed on) the target layout pattern.

Process 800 can then fragment the grid-based features along the defined fragmentation lines (task 816). In addition, process 800 generates a fragment data set (task 818) based upon the grid-based fragmentation performed during task 816. In the illustrated embodiment, the fragment data set is also generated in response to the non-grid-based fragmentation performed during task 810. In other words, the fragment data set may reflect the results of grid-based fragmentation and non-grid-based fragmentation. Process 800 then performs OPC on the resulting fragment data set to obtain a corrected data set (task 820). OPC manipulates the position of the fragmented edge segments as needed to correct for practical limitations, effects, and artifacts associated with practical mask fabrication techniques. For example, horizontal edge segments can be moved upward or downward as needed, and vertical edge segments can be moved to the left or right as needed. OPC is generally well known to those familiar with photolithography and mask fabrication. Accordingly, OPC itself will not be described in detail here. For instance, some OPC techniques are described in U.S. Pat. No. 7,080,349 (assigned to Advanced Micro Devices, Inc.); the relevant content of this patent is incorporated by reference herein.

The post-OPC corrected data set can then be further processed to define polygons that collectively represent the target layout pattern (task 822). In certain embodiments, the polygons will be rectangular in shape, as generally depicted in FIG. 5 and FIG. 7. The processing of post-OPC data in this manner is sometimes referred to as fracturing, where the post-OPC data is fractured into corresponding polygons. In conjunction with task 822, process 800 may define and/or create the polygons such that they are conveyed in a mask-writer-compatible format. Thus, task 822 may generate an electronic file that is formatted for compatibility with the particular mask writer being used to create the photolithography mask. This mask writer file can be saved (task 824) by the host computer system for transfer or communication to the mask writer tool. Alternatively or additionally, a computer-readable mask writer file can be saved by the mask writer tool itself. In practice, the mask writer file is saved on a computer-readable medium, such as a hard disk, a portable memory disk, or the like.

Next, process 800 can write the corresponding photolithography mask using the mask writer file. Notably, the mask writer file conveys and defines the polygons, which in turn were created based at least in part upon the grid-based OPC fragmentation technique described here. Once the mask writer obtains a suitably formatted mask writer file, it operates in a conventional manner to write/create the mask itself. The operation of mask writers is generally well known to those familiar with photolithography and mask fabrication and, therefore, such operation will not be described in detail here. Thereafter, the photolithography mask can be used to fabricate/manufacture semiconductor devices in accordance with photolithography techniques such as that described above with reference to FIG. 2. Indeed, any number of masks can be created using the fragmentation techniques described herein, and those masks can be used in separate photolithography steps during the manufacturing of a given semiconductor device.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An optical proximity correction (OPC) method for photolithography applications that is executed on a computer comprising a processor, the OPC method comprising:
   providing a target layout pattern that represents a corresponding mask pattern for a photolithography mask;
   operating the processor to fragment at least one feature of the target layout pattern using a fragmentation grid that is independent of the target layout pattern, wherein the fragmentation grid comprises orthogonal gridlines; and
   operating the processor to generate a fragment data set in response to fragmenting at least one feature of the target layout pattern.

2. The method of claim 1, further comprising:
   operating the processor to align the target layout pattern relative to the fragmentation grid.

3. The method of claim 1, further comprising:
   operating the processor to align the fragmentation grid relative to the target layout pattern.

4. The method of claim 1, wherein:
   the at least one feature of the target layout pattern includes an edge; and
   the fragmentation grid comprises orthogonal gridlines orthogonal to the edge.

5. The method of claim 1, wherein
   the method further comprises:
   operating the processor to define fragmentation lines for the at least one feature of the target layout pattern, the fragmentation lines corresponding to the orthogonal gridlines.

6. The method of claim 1, further comprising:
   operating the processor to perform OPC on the fragment data set to obtain a corrected data set.

7. The method of claim 6, further comprising:
   operating the processor to process the corrected data set to define polygons in a mask-writer-compatible format.

8. The method of claim 7, further comprising:
   operating the processor to write the photolithography mask using the polygons.

9. The method of claim 7, wherein the polygons are rectangles.

10. The method of claim 7, wherein:
operating the processor to process the corrected data set results in a computer-readable mask writer file; and
the method further comprises:
operating the processor to save the mask writer file on a computer-readable medium.

11. An optical proximity correction (OPC) method for photolithography applications executed on a computer comprising a processor, the method comprising:
providing a virtual fragmentation grid that is independent of a target layout pattern, wherein the virtual fragmentation grid comprises a plurality of orthogonal gridlines;
operating the processor to fragment at least one feature of the target layout pattern along the plurality of orthogonal gridlines to obtain a fragment data set, the target layout pattern corresponding to a mask pattern;
operating the processor to process the fragment data set to define polygons in a mask-writer-compatible format; and
writing a photolithography mask that is based upon the polygons.

12. The method of claim 11, further comprising:
operating the processor to align the target layout pattern and the virtual fragmentation grid relative to each other, prior to operating the processor to fragment at least one feature of the target layout pattern.

13. The method of claim 12, wherein:
the at least one feature of the target layout pattern includes an edge; and
operating the processor to align the target layout pattern and the virtual fragmentation grid results in the orthogonal gridlines being orthogonal to the edge.

14. The method of claim 11, wherein operating the processor to process the fragment data set comprises:
operating the processor to perform OPC on the fragment data set to obtain a corrected data set; and
operating the processor to fracture the corrected data set.

15. The method of claim 11, further comprising:
manufacturing a semiconductor device using the photolithography mask.

16. The method of claim 11, further comprising:
operating the processor to select, from the target layout pattern, at least one other feature; and
operating the processor to fragment the at least one other feature using a fragmentation scheme that does not rely on the virtual fragmentation grid.

17. A computer-executable program embodied on a non-transitory computer-readable medium, the program comprising computer-executable instructions for performing optical proximity correction (OPC) for photolithography applications, the program comprising:
instructions for obtaining a target layout pattern corresponding to a mask pattern for a photolithography mask;
instructions for providing a fragmentation grid that is independent of the target layout pattern, wherein the fragmentation grid comprises a plurality of orthogonal gridlines; and
instructions for fragmenting at least one feature of the target layout pattern along the plurality of orthogonal gridlines to obtain a fragment data set.

18. The program of claim 17, further comprising instructions for defining polygons in a mask-writer-compatible format, using the fragment data set.

19. The program of claim 17, further comprising:
instructions for aligning the target layout pattern and the fragmentation grid relative to each other such that the plurality of orthogonal gridlines are orthogonal to an edge of the at least one feature of the target layout pattern.

20. A semiconductor device fabrication method comprising:
providing a target layout pattern that represents a corresponding mask pattern;
performing grid-based optical proximity correction (OPC) fragmentation on at least one feature of the target layout pattern using a fragmentation grid that is independent of the target layout pattern, wherein the fragmentation grid comprises orthogonal gridlines;
in response to performing the grid-based OPC fragmentation, obtaining a fragment data set for the target layout pattern;
creating a photolithography mask using the fragment data set; and
fabricating at least one semiconductor device using the photolithography mask.

* * * * *